US012585272B1

(12) United States Patent
Jang et al.

(10) Patent No.: US 12,585,272 B1
(45) Date of Patent: Mar. 24, 2026

(54) ERROR PRIORITIZATION FOR IMPROVING MACHINE LEARNED MODELS

(71) Applicant: Zoox, Inc., Foster City, CA (US)

(72) Inventors: Minsu Jang, San Mateo, CA (US); Antonio Prioletti, Redwood City, CA (US)

(73) Assignee: Zoox, Inc., Foster City, CA (US)

( * ) Notice: Subject to any disclaimer, the term of this patent is extended or adjusted under 35 U.S.C. 154(b) by 1150 days.

(21) Appl. No.: 17/538,836

(22) Filed: Nov. 30, 2021

(51) Int. Cl.
*G05D 1/00* (2024.01)
*G06F 30/27* (2020.01)

(52) U.S. Cl.
CPC ........... *G05D 1/0088* (2013.01); *G06F 30/27* (2020.01)

(58) Field of Classification Search
CPC ........ G05D 1/0088; G06F 30/27; G06F 30/00
USPC ........................................... 703/8, 6
See application file for complete search history.

(56) References Cited

U.S. PATENT DOCUMENTS

| | | | | |
|---|---|---|---|---|
| 10,896,116 B1 * | 1/2021 | Gabrovski | .......... | G06F 11/3616 |
| 11,048,832 B2 * | 6/2021 | Alvarez | ................... | G06F 30/15 |
| 11,715,338 B2 * | 8/2023 | Vejalla | ................... | G07C 5/008 |
| | | | | 701/31.4 |
| 2017/0132334 A1 * | 5/2017 | Levinson | .............. | B60W 50/00 |

| | | | | |
|---|---|---|---|---|
| 2020/0351438 A1 | 11/2020 | Dewhurst | | |
| 2021/0049377 A1 * | 2/2021 | Hu | ........................ | G06T 7/0002 |
| 2021/0276587 A1 * | 9/2021 | Urtasun | .............. | G06F 11/3013 |
| 2022/0244736 A1 * | 8/2022 | Konrardy | .............. | G05D 1/617 |

FOREIGN PATENT DOCUMENTS

CA       3066337 A1     6/2021

OTHER PUBLICATIONS

Banerjee, et al., "Real-Time Error Detection in Nonlinear Control Systems Using Machine Learning Assisted State-Space Encoding," IEEE Transactions on Dependable and Secure Computing, vol. 18, No. 2, 2021, pp. 576-592.

* cited by examiner

*Primary Examiner* — Cedric Johnson
(74) *Attorney, Agent, or Firm* — Lee & Hayes, P.C.

(57) ABSTRACT

Techniques for determining whether a machine-learned model has improved or regressed in response to an update, as well as verifying whether those improvements or regressions impact overall vehicle safety, are described herein. The techniques may include running a simulation in which a simulated vehicle traverses a simulated environment. During the simulation, sensor data associated with the simulated environment may be input to the machine-learned model, which is configured for use in the real vehicle. As such, perception data outputs associated with objects detected in the simulated environment may be received from the machine-learned model during the simulation, and one or more error models may be generated based on the outputs and a ground truth. If the error model indicates that an error meets or exceeds a threshold error, the machine-learned model may be updated to reduce the error below the threshold.

20 Claims, 5 Drawing Sheets

VISUALIZATION
132(1)

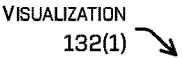
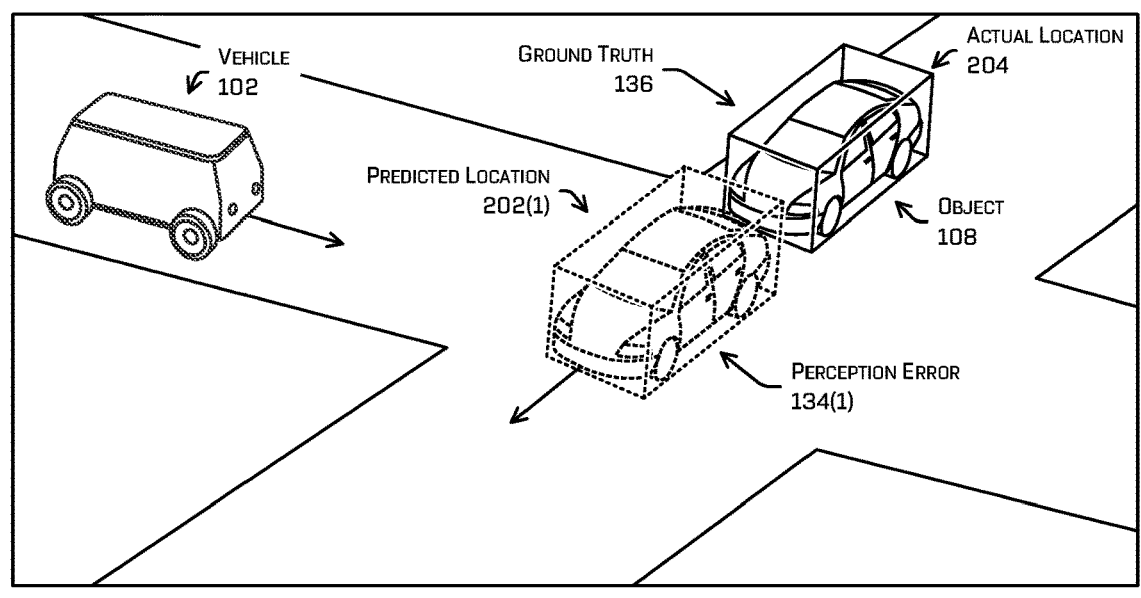
FIG. 2A
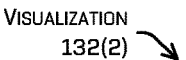
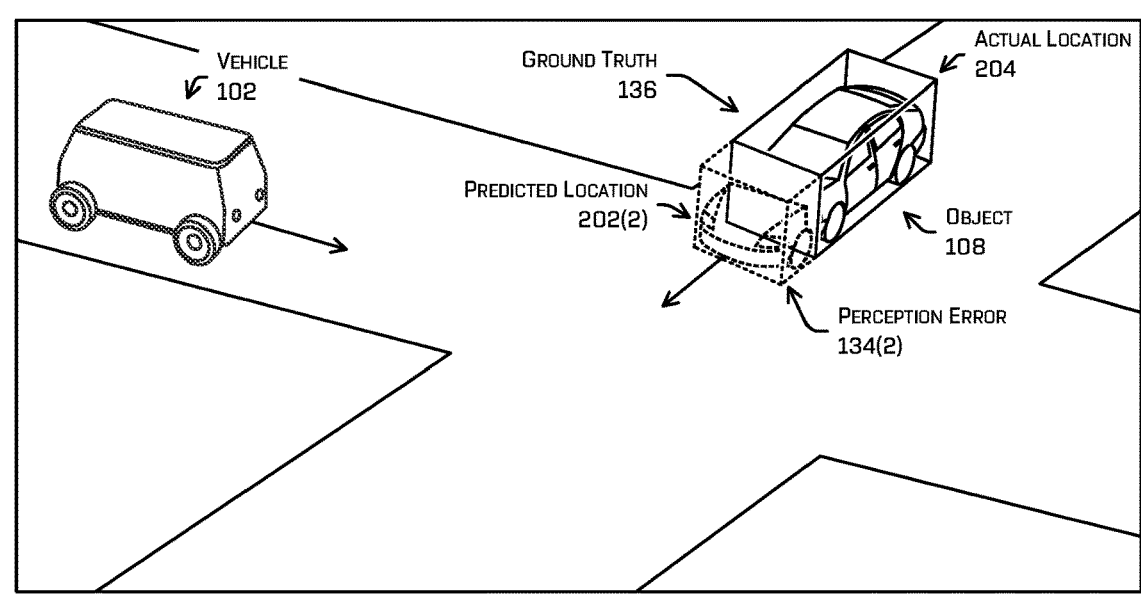
FIG. 2B

300
VISUALIZATION AT T₀
        132(1)
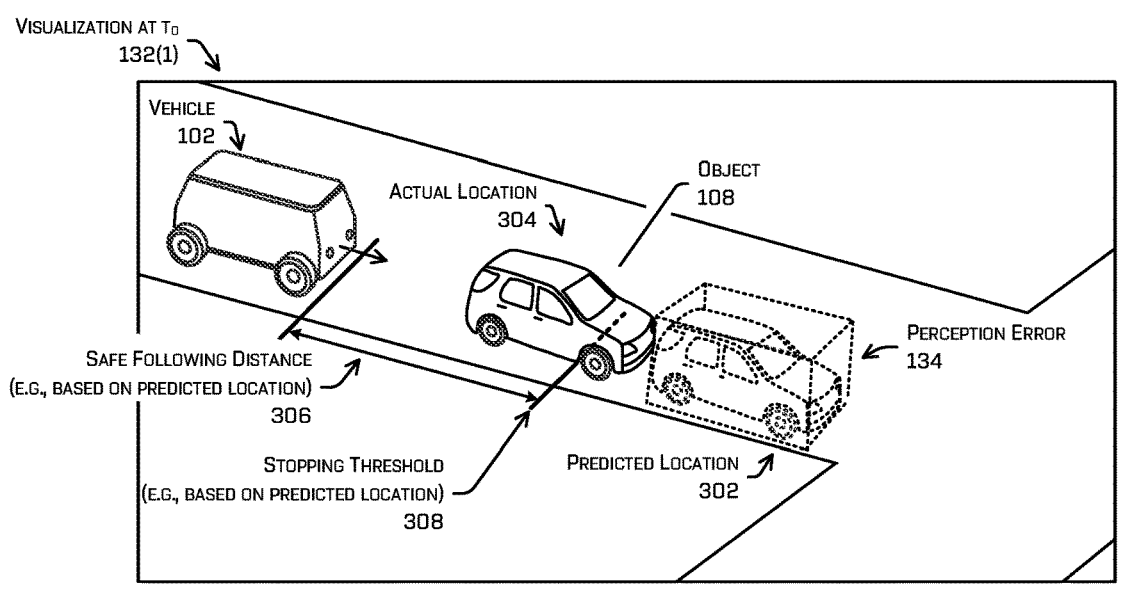
VEHICLE
102
ACTUAL LOCATION
304
OBJECT
108
PERCEPTION ERROR
134
SAFE FOLLOWING DISTANCE
(E.G., BASED ON PREDICTED LOCATION)
306
STOPPING THRESHOLD
(E.G., BASED ON PREDICTED LOCATION)
308
PREDICTED LOCATION
302
VISUALIZATION AT Tₙ
        132(N)
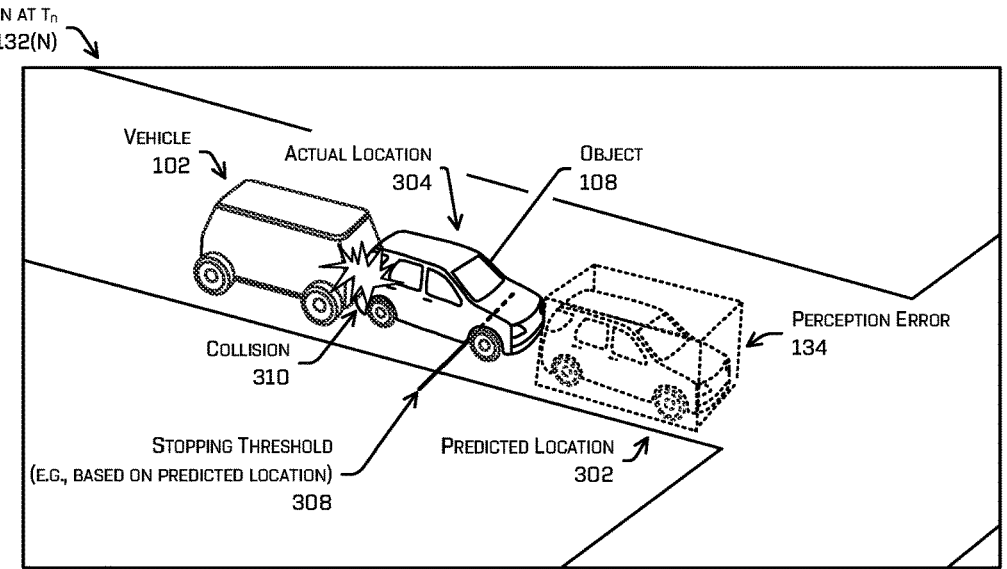
VEHICLE
102
ACTUAL LOCATION
304
OBJECT
108
PERCEPTION ERROR
134
COLLISION
310
STOPPING THRESHOLD
(E.G., BASED ON PREDICTED LOCATION)
308
PREDICTED LOCATION
302
FIG. 3

400

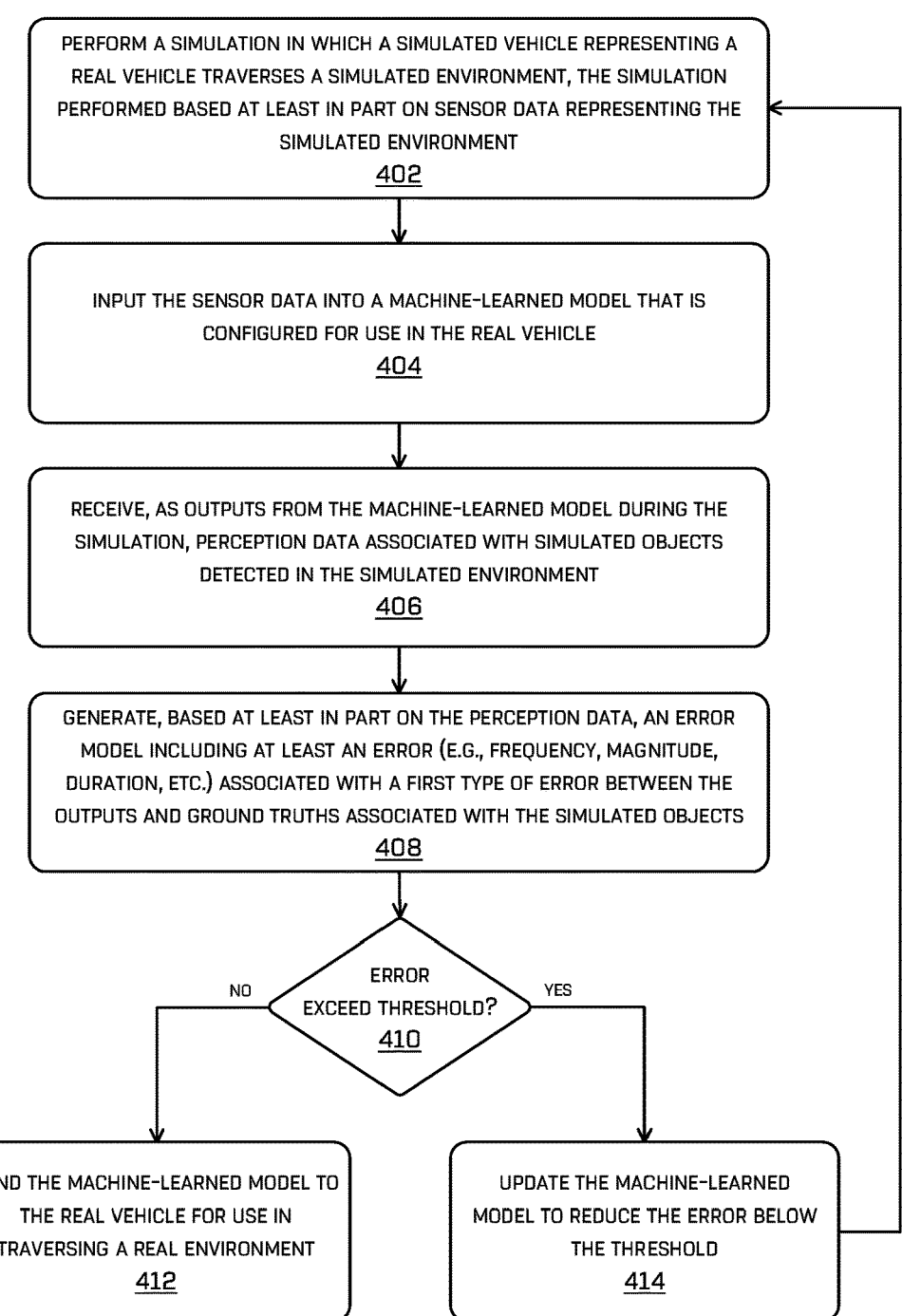

PERFORM A SIMULATION IN WHICH A SIMULATED VEHICLE REPRESENTING A REAL VEHICLE TRAVERSES A SIMULATED ENVIRONMENT, THE SIMULATION PERFORMED BASED AT LEAST IN PART ON SENSOR DATA REPRESENTING THE SIMULATED ENVIRONMENT
402

INPUT THE SENSOR DATA INTO A MACHINE-LEARNED MODEL THAT IS CONFIGURED FOR USE IN THE REAL VEHICLE
404

RECEIVE, AS OUTPUTS FROM THE MACHINE-LEARNED MODEL DURING THE SIMULATION, PERCEPTION DATA ASSOCIATED WITH SIMULATED OBJECTS DETECTED IN THE SIMULATED ENVIRONMENT
406

GENERATE, BASED AT LEAST IN PART ON THE PERCEPTION DATA, AN ERROR MODEL INCLUDING AT LEAST AN ERROR (E.G., FREQUENCY, MAGNITUDE, DURATION, ETC.) ASSOCIATED WITH A FIRST TYPE OF ERROR BETWEEN THE OUTPUTS AND GROUND TRUTHS ASSOCIATED WITH THE SIMULATED OBJECTS
408

ERROR EXCEED THRESHOLD?
410

NO          YES

SEND THE MACHINE-LEARNED MODEL TO THE REAL VEHICLE FOR USE IN TRAVERSING A REAL ENVIRONMENT
412

UPDATE THE MACHINE-LEARNED MODEL TO REDUCE THE ERROR BELOW THE THRESHOLD
414

FIG. 4

ERROR PRIORITIZATION FOR IMPROVING MACHINE LEARNED MODELS

BACKGROUND

Autonomous vehicles utilize various systems, methods, and apparatuses to traverse an environment. For instance, autonomous vehicles can utilize machine-learned models to navigate through environments where other vehicles, people, buildings, and other objects may be present. In some cases, developing trained machine-learned models for use in autonomous vehicle navigation can be challenging. For instance, if a model is updated, it can be difficult to determine whether the update resulted in an improvement to the model or, conversely, a regression. Similarly, it can be difficult to determine whether an update to a model is actually improving the overall performance or safety of the autonomous vehicle.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 2A illustrates an example visualization of an error between a perception system output associated with an object and a ground truth associated with the object.

FIG. 2B illustrates another example visualization of an error between an updated perception system output associated with the object and the ground truth, wherein the error has been reduced relative the error shown in FIG. 2A.

FIG. 3 illustrates a progression of an example visualization of a predicted collision between the vehicle and an object based at least in part on a perception error.

FIG. 4 is a flowchart illustrating an example process associated with running a simulation to determine whether errors associated with outputs from a machine-learned model exceed a threshold.

DETAILED DESCRIPTION

Figure 1:
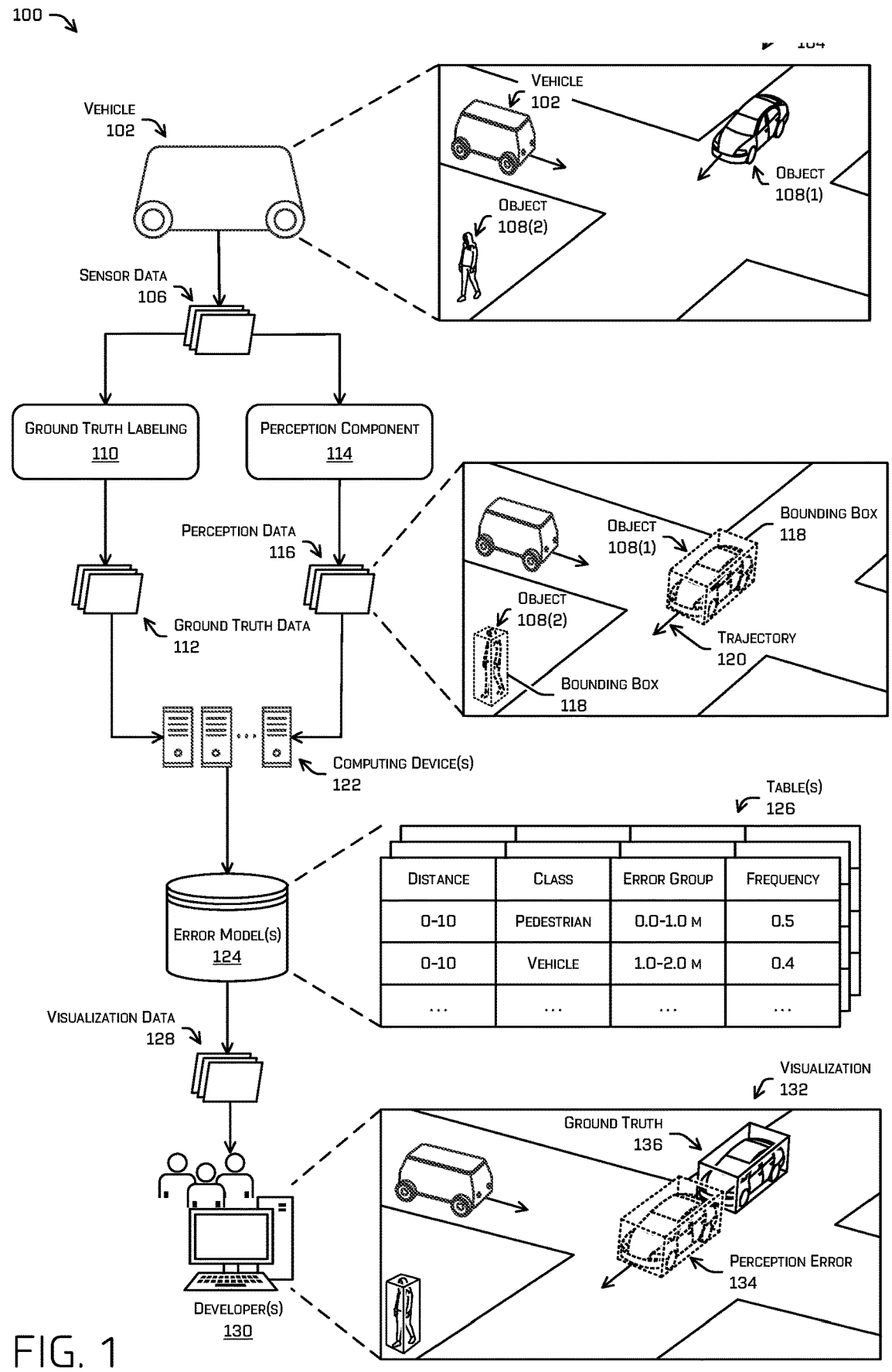
FIG. 1 is a pictorial flow diagram illustrating an example process according to the techniques described herein for determining an effect of an error associated with an output from a vehicle perception system.

As noted above, developing trained machine-learned models for use in autonomous vehicle navigation can be challenging. For instance, if a model is updated, it can be difficult to determine whether the update resulted in one or more improvement(s) to certain aspects of the model and/or regression(s) to other aspects of the model. Similarly, it can be difficult to determine whether an update to a model is actually improving the overall performance or safety of the autonomous vehicle. Take, for example, a machine-learned model that receives, as inputs, sensor data (e.g., lidar data, radar data, image data, etc.) representing an environment in which a vehicle is operating and outputs bounding boxes (e.g., three-dimensional (3D) bounding boxes) associated with objects detected in the environment. In some instances, updates may be made to the machine-learned model to enhance the performance of the model. Such updates can include updated model components, updated model or component software, re-training the model with a new or different dataset, or the like. When an update is made, the performance of the updated model may be tested using simulation techniques. However, minor differences in simulations may make the results difficult to interpret whether the model has improved or regressed, especially as improvements become less significant (e.g., as the model improves and outputs become closer to ground truth, updates may render minimal improvements).

Described herein are techniques associated with determining whether a machine-learned model has improved or regressed in response to an update, as well as verifying whether those improvements or regressions impact overall vehicle safety (e.g., by not increasing a likelihood of the vehicle experiencing an adverse event, such as a collision, driving in front of a moving object, exceeding a braking force, etc.). In some examples, a simulation may be run in which a simulated vehicle representing a real vehicle traverses a simulated environment. During the simulation, sensor data associated with the simulated environment may be input to a perception system that is configured for use in the real vehicle. The perception system may, in some examples, include one or multiple machine-learned models. Outputs received from the perception system during the simulation may include perception data that is associated with objects detected in the simulated environment. Based at least in part on the perception data outputs, an error model may be generated that may indicate, among other things, an error (e.g., frequency and/or magnitude) to which the outputs of the perception system deviate from ground truths associated with the objects. Additionally, a threshold error (e.g., frequency, magnitude, duration, and/or the like) associated with the perception system outputs may be determined. The threshold error may be determined such that a probability of a collision of the vehicle is minimized. As such, it can be determined whether the error meets or exceeds the threshold error and, if so, the perception system may be updated to reduce the error below the threshold error.

By way of example, and not limitation, a method according to this disclosure may include techniques of running a simulation associated with a vehicle. During the simulation, a simulated vehicle representing the vehicle may traverse a simulated environment based on sensor data. In at least one example, the sensor data may be log data that was generated or otherwise captured by a sensor system of a real vehicle that was operating in a real environment. In other examples, the sensor data may be simulated sensor data, which may not necessarily correspond with a real-life environment, but may otherwise be representative of a synthetic environment that is similar in kind with that of a real-life environment. In examples, the simulated vehicle may be controlled to traverse the simulated environment by one or more systems or components associated with a real vehicle, such as perception systems/components, prediction systems/components, planning systems/components, and other systems and/or components described herein. That is, sensor data associated with the simulation may be input into the systems and/or components associated with the real vehicle, and outputs from those systems and/or components may control the simulated vehicle in the simulated environment.

In at least one example, one or more simulations may be run to determine threshold errors for certain types of errors (e.g., yaw errors, velocity errors, size errors, extent errors, position/location errors, classification errors, etc.) associated with the outputs of the real vehicle systems or components. For instance, during a simulation, perception-related errors can be injected into the simulation (e.g., as perception system outputs) by inputting the perception related-errors to downstream systems and/or components of the vehicle that rely on the perception outputs, such as a planning system or prediction system of the vehicle. In some examples, the magnitudes of these injected errors may be varied to determine an allowable error the perception system can output without causing a collision of the vehicle. Put another way, the magnitudes or frequencies of the injected errors may be varied to determine how much error the downstream systems (e.g., the planning system, prediction system, etc.) of the vehicle can tolerate without causing the vehicle to experience a collision. For instance, a detected location of an object may be varied by 05. meters, 1 meter, 2 meters, etc. from its actual location until the error is determined to contribute to an adverse event. As another example, if the vehicle if following an object in the environment, a speed of the object may be varied from its actual speed to determine the point at which the variance in speed caused an adverse event.

In various examples, any number of different scenarios and/or perception errors associated with real-world conditions may be simulated, such as the vehicle following an object, a double-parked vehicle, jaywalking pedestrians, false-positive detections, false-negative detections, velocity errors, etc., and perception error results may be aggregated for these difference scenarios and/or errors to determine how the perception system is performing. That is, different scenarios can be simulated and the results aggregated to determine which perception error metrics are important across scenarios that represent real world conditions.

In another example, the threshold error frequencies and/or error magnitudes may be determined based on a "comfort score" associated with operating the vehicle, the comfort score being associated with not following other vehicles to closely, slowing down to use caution, waiting behind detected double-parked vehicles, minimizing abrupt accelerations and/or decelerations, or the like.

Additionally, in some examples, the techniques may include inputting, into a machine-learned model that is configured for use in the vehicle, sensor data associated with the environment (e.g., the simulated environment). In some examples, the machine-learned model may be part of the perception system of the vehicle. The perception system and/or the machine-learned model may be configured to detect objects in the environment, including dynamic objects that are capable of movement (e.g., vehicles, motorcycles, bicycles, pedestrians, animals, etc.) and/or static objects (e.g., buildings, road surfaces, trees, signs, barriers, curbs, parked vehicles, etc.). Additionally, the machine-learned model may further detect classifications of the objects (e.g., whether an object is a pedestrian, a cyclist, a car, a parked vehicle, etc.), as well as sizes of the objects, orientations of the objects, velocity of the objects, trajectories of the objects, locations of the objects, etc.

In some examples, outputs may be received from the machine-learned model, and the outputs may be used by downstream systems and/or components of the vehicle (e.g., planning component, prediction component, etc.) to control the simulated vehicle in the simulation. In at least one example, the outputs may include perception data associated with objects detected in the environment based on the sensor data. For any given output and/or object, the perception data may include, among other things, a bounding box associated with the object (e.g., a 2D or 3D bounding box). The bounding box may be indicative of a size of the object, orientation of the object (e.g., yaw), location of the object, extent of the object, or the like. Additionally, or alternatively, the perception data may include a predicted velocity associated with the object, a predicted classification associated with the object, a predicted trajectory of the object, or the like.

In some instances, one or multiple error models may be generated based at least in part on the outputs received from the machine-learned model. An error model may be in the form of a table that indicates various attributes associated with errors between detected objects and a ground truth associated with those objects. In some instances, a single error model may be generated for different situations and/or errors. For instance, a first error model may be generated for detected pedestrians who are in a crosswalk, a second error model may be generated for detected pedestrians who are jaywalking, a third error model may be generated for other vehicles that the simulated vehicle is following, a fourth error model may be generated for parked vehicles, and so forth. By way of example, and not limitation, individual error models may be generated for different poses of pedestrians (e.g., walking, sitting, crouching, standing, running, lying down, etc.), for different actions/maneuvers of other vehicles (e.g., driving toward, driving away, driving perpendicular, parked, turning, etc.), for cyclists, animals, or the like.

In some examples, an individual error model may indicate an error frequency and/or an error magnitude between outputs of the machine-learned model (e.g., perception data corresponding with detected objects) and a ground truth (e.g., labeled perception data corresponding with the detected objects). For instance, if the error model is for a pedestrian in a crosswalk, the error model may indicate an error frequency (e.g., error probability) and/or error magnitude (e.g., amount of error or difference) associated with the outputs. Additionally, the error model may further indicate distances associated with certain error probabilities and/or error magnitudes. For example, in the case of the crosswalking pedestrian error model, the error model may indicate a first error magnitude and/or error probability associated with a first distance (e.g., pedestrian is within 10 meters of the vehicle), a second error magnitude and/or error frequency associated with a second distance (e.g., pedestrian is between 10 meters and 20 meters from the vehicle), and so forth.

In some examples, the error models may be analyzed to determine whether any of the errors exceed the threshold errors. As such, if an error indicated in one of the error models exceeds the threshold, then that error may be likely to cause a collision or fail to maintain a comfort score.

Additionally, or alternatively, a first error model based on outputs from a first machine-learned model may be compared with a second error model based on outputs from a second machine-learned model (e.g., an updated version of the first machine-learned model) to determine whether the second machine-learned model has improved or regressed relative to the first machine-learned model. For instance, given a candidate error model and a control error model (e.g., from the first machine-learned model and the second machine-learned model), a list of regressions and improvements may be calculated for each interaction type, class, and/or error type. However, in order to highlight only the meaningful regressions and/or improvements, distributions of the errors within each distance condition may be compared and a regression/improvement may be defined if the difference is more significant than an estimated variance. Comparing the distribution instead of single probabilities for each error may help avoid false triggering of regression/ improvements due to a shift of the probability distribution.

In some instances, if an error model indicates that a machine-learned model is likely to cause collisions, likely to not maintain the comfort score, or if the machine-learned model is regressing, then the machine-learned model may be updated to reduce the error below the threshold error. For instance, a component of the machine-learned model may be updated, the machine-learned model may be retrained on a new data set, a weighting of cross functions of the machine-learned model may be changed, or the like. In at least one example, the updated version of the machine-learned model may be sent to the vehicle for use by the vehicle to traverse an environment. In some examples, one or more visualizations associated with outputs of the machine-learned model containing an error may be generated and/or displayed. The visualization(s) may be for use in identifying meaningful errors and/or updating the machine-learned model. Further details of the visualizations are described below in FIGS. 2A-3B.

According to the techniques described herein, the performance of machine-learned models can be improved. The disclosed error model generation techniques promote quantitative understanding of how much a perception error contributes to overall vehicle-level collision rates and/or increases (worsening) of comfort costs. In the context of autonomous vehicles, the techniques described herein provide for more accurate machine-learned models, which can increase the safety of autonomous vehicles by making more accurate predictions, which can promote safer decision making and minimize the risk of collisions. Additionally, the disclosed techniques promote optimization of machine-learned models, as well as insight into how changes and/or updates to machine-learned models impact the models' accuracy in making predictions/detections. These and other improvements will be readily apparent to those having ordinary skill in the art.

The techniques described herein can be implemented in a number of ways. Example implementations are provided below with reference to the following figures. Example implementations are discussed in the context of autonomous vehicles; however, the methods, apparatuses, and components described herein can be applied to a variety of components (e.g., a sensor component or a robotic platform), and are not limited to autonomous vehicles. For example, the techniques can be utilized in an aviation or nautical context, or in other machine-learning and training contexts. Furthermore, the techniques described herein can be used with real data (e.g., captured using sensor(s)), simulated data (e.g., generated by a simulator), or any combination of the two.

FIG. 1 is a pictorial flow diagram illustrating an example process 100 according to the techniques described herein for determining an effect of an error associated with an output from a vehicle perception system. In examples, the vehicle 102 may be associated with one or more sensor components. In at least one example, the sensor component(s) may capture sensor data 106 associated with an environment 104 surrounding the vehicle 102. The environment 104 may include one or more objects, such as the object 108(1), which is a vehicle, and the object 108(2), which is a pedestrian. In at least one example, the sensor component(s) may include lidar sensors, radar sensors, ultrasonic transducers, sonar sensors, location sensors (e.g., global positioning component (GPS), compass, etc.), inertial sensors (e.g., inertial measurement units, accelerometers, magnetometers, gyroscopes, etc.), cameras (e.g., RGB, IR, intensity, depth, etc.), wheel encoders, microphones, environment sensors (e.g., temperature sensors, humidity sensors, light sensors, pressure sensors, etc.), time of flight (ToF) sensors, etc. The sensor component(s) may generate sensor data 106 associated with the environment 104, which may include, but is not limited to, lidar data, radar data, ultrasonic transducer data, sonar data, location data (e.g., global positioning component (GPS), compass, etc.), pose data, inertial data (e.g., inertial measurement units data, accelerometer data, magnetometer data, gyroscope data, etc.), image data (e.g., RGB data, IR data, intensity data, depth data, etc.), wheel encoder data, microphone data, environment sensor data (e.g., temperature sensor data, humidity sensor data, light sensor data, pressure sensor data, etc.), ToF sensor data, etc.

In at least one example, the sensor data 106 may be sent to a ground truth labeling component 110. The ground truth labeling component 110 may include functionality for generating ground truth data 112 (e.g., ground truth perception data) based on the sensor data 106. For example, the ground truth data 112 may include bounding boxes (e.g., similar to or the same as the bounding boxes 118) for the objects 108 represented in the sensor data 106. In some examples, the ground truth data 112 may be generated or otherwise determined by a human labeler and/or a computer-based algorithm. For instance, in one example, the human labeler may generate the ground truth data 112 while, in other examples, the computer-based algorithm may generate the ground truth data 112. In at least one example, the computer-based algorithm may generate initial ground truth data and the human labeler may confirm or make corrections to the initial ground truth data to generate the ground truth data 112. In any way, the ground truth data 112 represents the actual environment 104 represented in the sensor data. In other words, errors between the ground truth data 112 and the environment 104, as the environment 104 actually exists, should be very minimal.

Additionally, the sensor data 106 may also be input to a perception component 114 that may be configured for use in the vehicle 102. The perception component 114 may generate perception data 116 based at least in part on input sensor data 106. In one example, the perception component 114 includes one or more machine-learned models and/or other computer-based algorithms for generating the perception data 116. The perception data 116 output by the perception component 114 may include, among other things, bounding boxes 118 associated with the objects 108, trajectories 120 associated with the objects, classifications associated with the objects 108, as well as other information. In some examples, the bounding boxes 118 may be indicative of information associated with the objects 108, such as a size (e.g., volume, length, width, height, etc.), extent, position, location, orientation, or the like. In some instances, the trajectory 120 may represent a speed, velocity, acceleration, etc. associated with a detected object, as well as, or in addition to, a direction of travel associated with the detected object.

The computing device(s) 122 may receive the ground truth data 112 and the perception data 116 and generate one or more error model(s) 124. The error model(s) 124 may be in the form of one or more table(s) 126. The error model(s) 124 may comprise discrete probability models conditioned on several parameters, such as object distance, error magnitude, error duration, etc., that describe the likelihood or frequency in which the perception component 114 makes a certain error that falls within a predefined error group. In examples, separate error models may be built for different perception component 114 outputs, object types, and interactions the object had with a planner component of the vehicle 102. By way of example, and not limitation, error types that may be captured in an error model 124 table 126 may include frame-based errors, such as object position, velocity, yaw, size, and extent, as well as event-based errors, such as false-negatives, false-positives, yaw flips, over-segmentation, or the like. Additionally, object types that may be included in an error model 124 table 126 may include vehicles, pedestrians, cyclists, animals, etc.

In some examples, per-frame errors may be determined by calculating a perception error based on a difference between the perception data 116 and the ground truth data 112, grouping the perception errors based at least in part on object distance and error magnitude, and then aggregating the grouped errors to generate an error probability table 126. For example, if there are total of 100 frames at a distance of 60 meters, and 90 of the 100 frames have a velocity error between 0-0.1 meters per second (m/s), and the remaining 10 frames have a velocity error between 0.1-0.2 m/s, then the error group at 0.1 m/s at the distance of 60 meters has a probability of 0.9, and the error group at 0.2 m/s at the distance of 60 meters has a probability of 0.1.

In some examples, a severity and/or magnitude may be determined for different, aggregated error types. In this way, the error model may indicate whether the perception system is performing better in some areas and worse in other areas (e.g., better at detecting pedestrians than cyclists, etc.). In some examples, the simulation techniques described herein may include the generation and evaluation of driving simulations based on synthetic and/or modified driving scenarios, as described in U.S. patent application Ser. No. 17/459,214, titled "Synthetic Generation of Simulation Scenarios and Probability-Based Simulation Evaluation, and filed on Aug. 27, 2021, which is incorporated herein by reference in its entirety and for all purposes. For instance, in order to generate perception errors to test drive system components of the vehicle and determine whether a perception error contributes to an adverse event, a synthetic or log-based driving scenario may be modified using operational parameters that control the attributes and behaviors of one or more simulated objects within the driving scenario.

In some examples, per-event errors may be determined based at least in part on an interaction period associated with each object 108. For example, if a pedestrian is flagged at time 1.0 seconds, and the flag disappeared at 1.5 seconds but then reappeared at 2 seconds and lasted until 4 seconds, the entire period from 1-4 seconds may be considered. Based on the period, the error duration may then be calculated at various distances.

In some examples, visualization data 128 associated with certain errors between the ground truth data 112 and the perception data 116 may be output by the computing device(s) 122 to one or more developer(s) 130. The developer(s) 130 may utilize visualizations 132 based on the visualization data 128 to update the perception component 114 and/or one or more machine-learned models of the perception component 114. A visualization may illustrate a perception error 134 associated with a detected object relative to a ground truth 136 associated with the object. The ground truth may be displayed based at least in part on the ground truth data 112, and the perception error 134 may be displayed based at least in part on the perception data 116. In some examples, the visualization data 128 associated with a perception error 134 may be selected by the computing device(s) 122 for output based on the perception error 134 causing a collision of the vehicle 102. Additionally, or alternatively, the visualization data 128 may be selected based on the perception error 134 being greater than a threshold error relative to the ground truth 136. In some examples, the visualization data 128 may include multiple visualizations 132 associated with multiple different perception errors 134.

Based on the visualization 132, the developer(s) 130 may update the perception component 114 to minimize a difference between the perception error 134 and the ground truth 136. For instance, the developer(s) 130 may retrain the perception component 114 or one or more machine-learned models of the perception component 114 using a new dataset, change a weighting of a cross function of a machine-learned model of the perception component 114, or the like. After the perception component 114 has been updated, the updated version of the perception component 114 may be sent to one or more vehicles, including the vehicle 102, for use in traversing a real environment.

FIG. 2A illustrates an example visualization 132(1) of a perception error 134(1) associated with an object 108 relative to a ground truth 136 associated with the object 108. The visualization 132(1) may, as described above and herein, be utilized by a developer to update a perception system of the vehicle 102 and/or a machine-learned model of the perception system.

In FIG. 2A, the perception system of the vehicle 102 has determined that the object 108 (another vehicle) is in a predicted location 202(1) that differs from an actual location 204 of the object 108 as shown by the ground truth 136. That is, the perception system has determined that the object 108 is ahead of its actual location 204. Although illustrated in FIG. 2A as a location-related error, types of errors can also be displayed in a visualization, such as an object orientation error, object size error, object extent error, or the like. The visualization 132(1) may be used to update the perception system of the vehicle 102 to reduce the difference between the perception error 134(1) and the ground truth 136, a result of which is illustrated in FIG. 2B. In some examples, in the visualization 132(1) the object 108 and any data associated with the object 108 may be highlighted or otherwise made to visually stand out as an object of interest in the visualization 132(1) based at least in part on the perception error 134(1).

FIG. 2B illustrates another example visualization 132(2) of another perception error 134(2) associated with the object 108 relative to the ground truth 136 associated with the object 108. The perception error 134(2) has been reduced relative the perception error 134(1) shown in FIG. 2A.

In FIG. 2B, the perception system of the vehicle 102 has determined that the object 108 (the other vehicle) is in the predicted location 202(2), which differs from the actual location 204 of the object 108 as shown by the ground truth 136. However, the difference between the predicted location 202(2) and the actual location 204 has been reduced relative to the difference between the predicted location 202(1) and the actual location 204 illustrate in FIG. 2A. For instance, the developer may have utilized the visualization 132(1) to update the perception system of the vehicle 102 and/or the machine-learned model of the perception system, and the visualization 132(2) may have been generated based on a perception data output of the updated perception system.

In some examples, in the visualization 132(2) the object 108 and any data associated with the object 108 may be highlighted or otherwise made to visually stand out as an object of interest in the visualization 132(2) based at least in part on the perception error 134(2). In some instances, visualizations 132(1) and 132(2) may be presented side-by-side on a display for comparison for the developer to update the perception system of the vehicle 102.

FIG. 3 illustrates a progression 300 of an example visualization of a predicted collision 310 between the vehicle 102 and an object 108 based at least in part on a perception error 134. The perception error 134 causes a controller of the vehicle 102 to believe that the object 108 (which is another vehicle) is located at a predicted location 302, which, however, is different from an actual location 304 of the object 108.

In the visualization 132(1) at a time to, the perception system of the vehicle 102 predicts that the object 108 is located at the predicted location 302. As such, a controller of the vehicle 102 (e.g., a planning component, prediction component, etc.) causes the vehicle 102 to follow being the predicted location 302 of the object 108 by a safe following distance 306, as well as to prepare to stop before a stopping threshold 308 to, for instance, maintain a comfort score. However, because the object 108 is positioned at the actual location 304, which is within the safe following distance 306 and located before the stopping threshold 308, a collision 310 between the vehicle 102 and the object 108 occurs in the visualization 132(N) at a time tn.

In some examples, the amount of perception error 134 (e.g., an amount of difference between the predicted location 302 and the actual location 304) may be varied during a simulation until the collision 310 occurs. For instance, this may be performed to determine a maximum tolerance that the controller of the vehicle 102 (e.g., the planning component, prediction component, etc.) has to perception errors. Once the maximum tolerance is determined, this tolerance may be used during error model generation to determine whether certain error magnitudes or frequencies increase the probability of a collision, which helps optimize training of the perception system of the vehicle 102, as well as increases safety. In some examples, one or more metrics (e.g., object location, object orientation, object velocity, etc.) may be varied during simulations to determine which metrics contribute to adverse events.

FIG. 4 is a flowchart illustrating an example process 400 associated with running a simulation to determine whether errors associated with outputs from a machine-learned model exceed a threshold. By way of example, the process 400 is illustrated as a logical flow graph, each operation of which represents a sequence of operations that can be implemented in hardware, software, or a combination thereof. In the context of software, the operations may represent computer-executable instructions stored on one or more computer-readable storage media that, when executed by one or more processors, perform the recited operations. Generally, computer-executable instructions may include routines, programs, objects, components, data structures, or the like that perform particular functions or implement particular abstract data types.

In the process 400, the order in which the operations are described is not intended to be construed as a limitation, and any number of the described operations can be combined (or omitted) in any order and/or in parallel to implement the process 400. In some examples, multiple branches represent alternate implementations that may be used separately or in combination with other operations discussed herein. The process 400 illustrated may be described with reference to components and elements described above with reference to FIG. 1 for convenience and ease of understanding. However, the process 400 is not limited to being performed using these components, and the components are not limited to performing the process 400.

The process 400 begins at operation 402, which includes performing a simulation in which a simulated vehicle representing a real vehicle traverses a simulated environment, the simulation performed based at least in part on sensor data representing the simulated environment. For instance, sensor data 106 captured by a real vehicle 102 operating in a real environment may be used for the simulation. Additionally, or alternatively, simulated sensor data may be generated for use in the simulation. In some examples, the simulated vehicle may traverse the simulated environment based on outputs from one or more systems that are configured for use in the real vehicle, such as a perception system, a planning system, a prediction system, or the like.

At operation 404, the process 400 includes inputting the sensor data into a machine-learned model that is configured for use in the real vehicle. For instance, the sensor data 106 may be input into the perception component 114, which may include one or more machine-learned models and/or computer-based algorithms. In various examples, the sensor data is input to the machine-learned model during the simulation.

At operation 406, the process 400 includes receiving, as outputs from the machine-learned model during the simulation, perception data associated with simulated objects detected in the simulated environment. For instance, the perception component 114 may output perception data that indicates, among other things, the detected, simulated objects in the simulated environment, predicted bounding boxes 118 associated with the simulated objects, predicted trajectories 120 associated with the simulated objects, or the like. In some examples, the outputs from the machine-learned model are received by the computing device(s) 122.

At operation 408, the process 400 includes generating, based at least in part on the perception data, an error model including at least an error (e.g., frequency, magnitude, etc.) associated with a first type of error between the outputs and ground truths associated with the simulated objects. For instance, the computing device(s) 122 may generate one or more error model(s) 124 associated with errors between the perception data 116 and the ground truth data 112. In some examples, the error model may be in the form of a table that indicates various attributes associated with errors between detected objects and a ground truth associated with those objects. In some instances, a single error model may be generated for different situations and/or error types. For instance, a first error model may be generated for detected pedestrians who are in a crosswalk, a second error model may be generated for detected pedestrians who are jaywalking, a third error model may be generated for other vehicles that the simulated vehicle is following, a fourth error model may be generated for parked vehicles, and so forth. By way of example, and not limitation, individual error models may be generated for different poses of pedestrians (e.g., walking, sitting, crouching, standing, running, lying down, etc.), for different actions/maneuvers of other vehicles (e.g., driving toward, driving away, driving perpendicular, parked, turning, etc.), for cyclists, animals, or the like.

In some examples, an individual error model may indicate an error frequency and/or an error magnitude between the outputs of the machine-learned model (e.g., perception data corresponding with detected objects) and the ground truth (e.g., human-labeled perception data corresponding with the detected objects). For instance, if the error model is for a pedestrian in a crosswalk, the error model may indicate an error frequency (e.g., error probability) and/or error magnitude (e.g., amount of error or difference) associated with the outputs. Additionally, the error model may further indicate distances associated with certain error probabilities and/or error magnitudes. For example, in the case of the crosswalking pedestrian error model, the error model may indicate a first error magnitude and/or error probability associated with a first distance (e.g., pedestrian is within 10 meters of the vehicle), a second error magnitude and/or error frequency associated with a second distance (e.g., pedestrian is between 10 meters and 20 meters from the vehicle), and so forth.

At operation 410, the process 400 includes determining whether the error exceeds a threshold error. For instance, the computing device(s) 122 may determine whether the error exceeds the threshold. In at least one example, additional simulation(s) may be performed to determine the threshold. For instance, during the additional simulation(s), perception-related errors can be injected into the additional simulation(s) (e.g., as perception system outputs) by inputting the perception related-errors to downstream systems and/or components that are configured for use in the real vehicle. These downstream systems and/or components may rely on the perception outputs, such as a planning system or prediction system of the vehicle, to generate their own outputs. In some examples, the magnitude, frequency, duration, etc. of these injected errors may be varied to determine how much error the perception system outputs can allow without causing a collision of the vehicle. Put another way, the magnitudes, frequency, and/or duration of the injected errors may be varied to determine how much error the downstream systems (e.g., the planning system, prediction system, etc.) can tolerate without causing the simulated vehicle to experience a collision.

In another example, the threshold error may be determined based on a comfort score associated with operating the vehicle. The comfort score may be associated with not following other vehicles to closely, slowing down to use caution, waiting behind detected double-parked vehicles, or the like. Additionally, or alternatively, the threshold may be a threshold difference between the error and a previous error associated with the same type of errors based on outputs from a previous version of the machine-learned model.

At operation 410, if it is determined that the error does not exceed the threshold error, then the process 400 proceeds to operation 412. Alternatively, if it is determined at operation 410 that the error does exceed the threshold error, then the process 400 proceeds to operation 414.

At operation 412, the process 400 includes sending the machine-learned model to the real vehicle for use in traversing a real environment. For instance, the machine-learned model may be sent to the vehicle 102 for use by the vehicle 102 to traverse the environment 104. Additionally, the machine-learned model may be sent to one or more other vehicles of a fleet of vehicles for use by the one or more other vehicles to traverse environments.

At operation 414, the process 400 includes updating the machine-learned model to reduce the error below the threshold error. For instance, the computing device(s) 122 or the developer(s) 130 may update the machine-learned model to reduce the error below the threshold error. In some examples, this may comprise retraining the machine-learned model on new data, altering a component of the machine-learned model, changing a weighting of a cross function of the machine-learned model, or the like. After operation 414, the process 400 may proceed to operation 402 so that a simulation may be ran using the updated version of the machine-learned model in order to generate another error model associated with the updated version of the machine-learned model. In this way, it can be determined whether the updated version is improving or regressing in response to the update.

Figure 5:
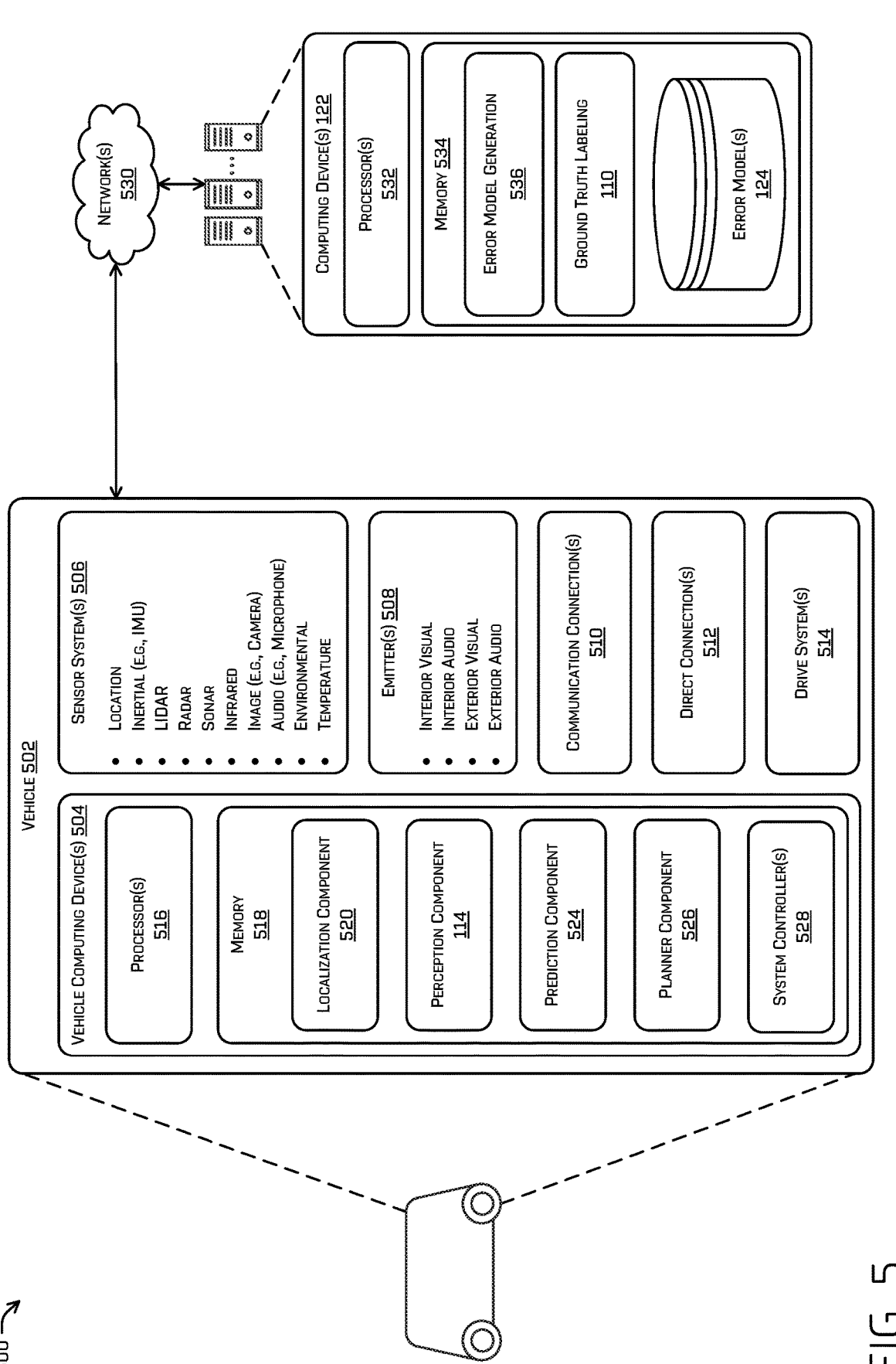
FIG. 5 is a block diagram illustrating an example system that may be used for performing the techniques described herein.

FIG. 5 is a block diagram illustrating an example system 500 that may be used for performing the techniques described herein. In at least one example, a vehicle 502, which can correspond to the vehicle 102 described above with reference to FIGS. 1-3, can include one or more vehicle computing device(s) 504, one or more sensor systems 506, one or more emitters 508, one or more communication connections 510, at least one direct connection 512, and one or more drive systems 514.

In at least one example, a vehicle 502 can be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such an example, since the vehicle 502 can be configured to control all functions from start to stop, including all parking functions, it can be unoccupied. This is merely an example, and the components and methods described herein can be incorporated into any ground-borne, airborne, or waterborne vehicle, including those ranging from vehicles that need to be manually controlled by a driver at all times, to those that are partially or fully autonomously controlled. That is, in the illustrated example, the vehicle 502 is an autonomous vehicle; however, the vehicle 502 could be any other type of vehicle. While only a single vehicle 502 is illustrated in FIG. 5, in a practical application, the example system 500 can include a plurality of vehicles, which, in some examples, can comprise a fleet of vehicles.

The vehicle computing device(s) 504 can include processor(s) 516 and memory 518 communicatively coupled with the processor(s) 516. In the illustrated example, the memory 518 of the vehicle computing device(s) 504 stores a localization component 520, the perception component 114, a prediction component 524, a planner component 526, and one or more system controllers 528.

In at least one example and as described above, the localization component 520 can determine a pose (position and orientation) of the vehicle 502 in relation to a local and/or global map based at least in part on sensor data received from the sensor component(s) 506 and/or map data associated with a map of an environment in which the vehicle 502 is operating. In at least one example, the localization component 520 can include, or be associated with, a calibration component that is capable of performing operations for calibrating (determining various intrinsic and extrinsic parameters associated with any one or more of the sensor component(s) 506), localizing, and mapping substantially simultaneously.

In at least one example, the perception component 114 can perform object detection, segmentation, and/or classification based at least in part on sensor data received from the sensor component(s) 506. In at least one example, the perception component 114 can receive raw sensor data (e.g., from the sensor component(s) 506). In at least one example, the perception component 114 can receive sensor data and can utilize one or more processing algorithms and/or machine-learned models to perform object detection, segmentation, and/or classification with respect to object(s) identified in the sensor data. In some examples, the perception component 114 can associate a bounding region (e.g., bounding box or otherwise an instance segmentation) with an identified object and can associate a confidence score associated with a classification of the identified object with the identified object.

The prediction component 524 can receive sensor data from the sensor component(s) 506, map data, and/or perception data output from the perception component 114 (e.g., processed sensor data), and can output predictions associated with one or more objects within the environment of the vehicle 502. Predictions can include predicted trajectories associated with objects in the environment in which the vehicle 502 is operating.

The planning component 526 may receive data, information, and/or outputs from the localization component 520, the perception component 114, the prediction component 524, as well as map data, and may generate one or more proposed vehicle operations (e.g., proposed trajectories). Additional details of localization components, perception components, prediction components, and/or planner components that are usable can be found in U.S. Pat. No. 9,512,123, issued on Apr. 4, 2017, and U.S. Pat. No. 10,353,390, issued on Jul. 16, 2019, the entire contents of both of which are incorporated by reference herein in their entirety and for all purposes. In some examples (e.g., where the vehicle 502 is not an autonomous vehicle), one or more of the aforementioned components can be omitted from the vehicle 502.

In at least one example, the vehicle computing device(s) 504 can include one or more system controllers 528, which can be configured to control steering, propulsion, braking, safety, emitters, communication, and other systems of the vehicle 502. These system controller(s) 528 can communicate with and/or control corresponding systems of the drive system(s) 514 and/or other systems of the vehicle 502.

While the components described above are illustrated as "onboard" the vehicle 502, in other implementations, the components can be remotely located and/or accessible to the vehicle 502. For instance, the component can be remotely located on the computing device(s) 122 and accessible to the vehicle 502 via one or more network(s) 530. Furthermore, while the components are described above as "components," such components can comprise one or more components and/or modules, which can be part of a system, for performing operations attributed to each of the components.

In at least one example, the localization component 520, the perception component 114, the prediction component 524, and the planner component 526 can process data, as described above, and can send their respective outputs over the network(s) 530, to computing device(s) 122. In at least one example, the localization component 520, the perception component 114, the prediction component 524, and the planner component 526 can send their respective outputs to the computing device(s) 122 at a particular frequency, after a lapse of a predetermined period of time, in near real-time, etc.

In at least one example, the sensor component(s) 506 can include lidar sensors, radar sensors, ultrasonic transducers, sonar sensors, location sensors (e.g., GPS, compass, etc.), inertial sensors (e.g., inertial measurement units, accelerometers, magnetometers, gyroscopes, etc.), cameras (e.g., RGB, IR, intensity, depth, etc.), wheel encoders, audio sensors, environment sensors (e.g., temperature sensors, humidity sensors, light sensors, pressure sensors, etc.), ToF sensors, etc. The sensor component(s) 506 can provide input to the vehicle computing device(s) 504. In some examples, the sensor component(s) 506 can preprocess at least some of the sensor data prior to sending the sensor data to the vehicle computing device(s) 504. In at least one example, the sensor component(s) 506 can send sensor data, via the network(s) 530, to the computing device(s) 122 at a particular frequency, after a lapse of a predetermined period of time, in near real-time, etc.

The vehicle 502 can also include one or more emitters 508 for emitting light and/or sound, as described above. The emitter(s) 508 in this example include interior audio and visual emitters to communicate with passengers of the vehicle 502. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), or the like. The emitter(s) 508 in this example also include exterior emitters. By way of example and not limitation, the exterior emitters in this example include light emitters (e.g., indicator lights, signs, light arrays, etc.) to visually communicate with pedestrians, other drivers, other nearby vehicles, etc., one or more audio emitters (e.g., speakers, speaker arrays, horns, etc.) to audibly communicate with pedestrians, other drivers, other nearby vehicles, etc., etc. In at least one example, the emitter(s) 508 can be positioned at various locations about the exterior and/or interior of the vehicle 502.

The vehicle 502 can also include communication connection(s) 510 that enable communication between the vehicle 502 and other local or remote computing device(s), such as the computing device(s) 122, as well as other remote or local computing device(s). For instance, the communication connection(s) 510 can facilitate communication with other local computing device(s) on the vehicle 502 and/or the drive system(s) 514. Also, the communication connection(s) 510 can allow the vehicle to communicate with other nearby computing device(s) (e.g., other nearby vehicles, traffic signals, etc.). The communications connection(s) 510 also enable the vehicle 502 to communicate with a remote teleoperations computing device or other remote services.

The communications connection(s) 510 can include physical and/or logical interfaces for connecting the vehicle computing device(s) 504 to another computing device or a network, such as network(s) 530. For example, the communications connection(s) 510 can enable Wi-Fi-based communication such as via frequencies defined by the IEEE 502.11 standards, short range wireless frequencies such as BLUETOOTH®, or any suitable wired or wireless communications protocol that enables the respective computing device to interface with the other computing device(s).

The direct connection 512 can directly connect the drive system(s) 514 and other systems of the vehicle 502. In at least one example, the vehicle 502 can include drive system(s) 514. In some examples, the vehicle 502 can have a single drive system 514. In at least one example, if the vehicle 502 has multiple drive systems 514, individual drive systems 514 can be positioned on opposite ends of the vehicle 502 (e.g., the front and the rear, etc.). In at least one example, the drive system(s) 514 can include sensor component(s) to detect conditions of the drive system(s) 514 and/or the surroundings of the vehicle 502. By way of example and not limitation, the sensor component(s) can include wheel encoder(s) (e.g., rotary encoders) to sense rotation of the wheels of the drive system, inertial sensors (e.g., inertial measurement units, accelerometers, gyroscopes, magnetometers, etc.) to measure position and acceleration of the drive system, cameras or other image sensors, ultrasonic sensors to acoustically detect objects in the surroundings of the drive system, lidar sensors, radar sensors, etc. Some sensors, such as the wheel encoder(s), can be unique to the drive system(s) 514. In some cases, the sensor component(s) on the drive system(s) 514 can overlap or supplement corresponding systems of the vehicle 502 (e.g., sensor component(s) 506).

The drive system(s) 514 can include many of the vehicle systems, including a high voltage battery, a motor to propel the vehicle 502, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, ahigh voltage cable, charging system, charge port, etc.). Additionally, the drive system(s) 514 can include a drive system controller which can receive and preprocess data from the sensor component(s) and to control operation of the various vehicle systems. In some examples, the drive system controller can include processor(s) and memory communicatively coupled with the processor(s). The memory can store one or more components to perform various functionalities of the drive system(s) 514. Furthermore, the drive system(s) 514 also include communication connection(s) that enable communication by the respective drive system with other local or remote computing device(s).

In FIG. 5, the vehicle computing device(s) 504, sensor component(s) 506, emitter(s) 508, and the communication connection(s) 510 are shown onboard the vehicle 502. However, in some examples, the vehicle computing device(s) 504, sensor component(s) 506, emitter(s) 508, and the communication connection(s) 510 can be implemented outside of an actual vehicle (i.e., not onboard the vehicle 502).

As described above, the vehicle 502 can send data to the computing device(s) 122, via the network(s) 530. In some examples, the vehicle 502 can send raw sensor data to the computing device(s) 122. In other examples, the vehicle 502 can send processed sensor data and/or representations of sensor data to the computing device(s) 122 (e.g., data output from the localization component 520, the perception component 114, the prediction component 524, the planner component 526, the machine-learned models, etc.). In some examples, the vehicle 502 can send data to the computing device(s) 122 at a particular frequency, after a lapse of a predetermined period of time, in near real-time, etc.

The computing device(s) 122 can receive the data (raw or processed) from the vehicle 502 and/or other data collection devices, as well as data from one or more third party sources and/or systems. In at least one example, the computing device(s) 122 can include processor(s) 532 and memory 534 communicatively coupled with the processor(s) 532. In the illustrated example, the memory 534 of the computing device(s) 122 stores an error model generation component 536, the ground truth labeling component 110, and the error model(s) 124. In some examples, one or more of the systems and/or components can be associated with the vehicle 502 or other computing device(s) associated with the system 500 instead of, or in addition to, being associated with the memory 534 of the computing device(s) 122.

The error model generation component 536 includes functionality to generate one or more error model(s) associated with the perception component 114 and/or one or more machine-learned models of the vehicle 502. For instance, the error model generation component 536 may receive, as inputs, perception data from the perception component 114 and ground truth data from the ground truth labeling component 110. Based on these inputs, the error model generation component 536 may generate one or more error model(s) for different types of errors associated with the perception data. The error model(s) may be in the form of tables, as described herein. In at least one example the error model generation component 536 can include functionality to identify which errors are less than, equal to, or greater than a threshold error frequency that is associated with increasing a probability of the vehicle 502 experiencing a collision.

The processor(s) 516 of the vehicle 502 and the processor(s) 532 of the computing device(s) 122 can be any suitable processor capable of executing instructions to process data and perform operations as described herein. By way of example and not limitation, the processor(s) 516 and 532 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

Memory 518 and 534 are examples of non-transitory computer-readable media. Memory 518 and 534 can store an operating system and one or more software applications, instructions, programs, and/or data to implement the methods described herein and the functions attributed to the various systems. In various implementations, the memory can be implemented using any suitable memory technology, such as static random receive memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

It should be noted that while FIG. 5 is illustrated as a distributed system, in some examples, components of the vehicle 502 can be associated with the computing device(s) 122 and/or the components of the computing device(s) 122 can be associated with the vehicle 502. That is, the vehicle 502 can perform one or more of the functions associated with the computing device(s) 122, and vice versa.

Furthermore, while the vehicle computing device(s) 504 and the computing device(s) 122 are shown to include multiple components, in some examples, such components can be associated with more or fewer individual components. For example, the localization component 520, the perception component 114, the prediction component 524, and/or the planner component 526 can be combined into a single component. Additionally, the error model generation component 536 and the ground truth labeling component 110 can be combined into a single component. That is, while depicted as separate components, any one or more of the components can be combined.

Example Clauses

A. A system comprising: one or more processors; and one or more non-transitory computer-readable media storing instructions that, when executed by the one or more processors, cause the system to perform operations comprising: inputting, into a first version of a perception system that is configured for use in an autonomous vehicle, sensor data associated with a simulated environment; receiving, as outputs from the first version of the perception system, perception data associated with objects detected by a simulated vehicle representing the autonomous vehicle traversing the simulated environment; generating, based at least in part on the perception data, a first error model indicating at least a first error between outputs of the first version of the perception system and a ground truth associated with the sensor data; receiving a second error model indicating at least a second error between outputs of a second version of the perception system and the ground truth; determining, based at least in part on a simulation using a planning component of the autonomous vehicle, that the first error and the second error are of an error type that is associated with contributing to an adverse event; determining that the first version of the perception system is an improvement over the second version of the perception system based at least in part on a difference between the first error and the second error meeting or exceeding a threshold difference; and sending the first version of the perception system to the autonomous vehicle based at least in part on the improvement.

B. The system as recited in paragraph A, wherein the perception data includes at least one of: a bounding box indicative of at least one of a size, an orientation, or a location of an object of the objects; a velocity of the object; or a classification associated with the object.

C. The system as recited in any one of paragraphs A-B, wherein the threshold difference is associated with reducing a probability of a collision of the autonomous vehicle, the threshold difference determined based at least in part on: inputting simulated perception data errors into at least one of the planning component or a prediction component of the autonomous vehicle, wherein the at least one of the planning component or the prediction component controls the simulated vehicle to traverse the simulated environment based at least in part on the simulated perception data errors; and determining whether the simulated vehicle experienced a collision while traversing the simulated environment, the collision based at least in part on the simulated perception data errors.

D. The system as recited in any one of paragraphs A-C, wherein the first version of the perception system and the second version of the perception system each include one or more machine learned models, the one or more machine-learned models of the first version of the perception system including an updated parameter relative to the second version of the perception system.

E. The system as recited in any one of paragraphs A-D, the operations further comprising outputting, based at least in part on the difference: a first visual representation of a first output of the first version of the perception system relative to the ground truth; and a second visual representation of a second output of the second version of the perception system relative to the ground truth.

F. A method comprising: inputting, into a machine-learned model that is configured for use in a vehicle, sensor data associated with an environment; receiving, as outputs from the machine-learned model, perception data associated with objects detected in the environment; determining, based at least in part on the perception data, an error model including an error between an output of the machine-learned model and a ground truth associated with the sensor data; determining, based at least in part on a simulation using a planning component, that the error contributes to an adverse event; and based at least in part on the error contributing to the adverse event, determining that the machine-learned model is a regression to the vehicle.

G. The method as recited in paragraph F, further comprising: updating the machine-learned model based at least in part on the error; and sending, to the vehicle, an updated version of the machine-learned model for use by the vehicle to traverse an environment.

H. The method as recited in any one of paragraphs F-G, further comprising providing a visualization associated with updating the machine-learned model, the visualization including at least a first visual representation of an output of the machine-learned model relative to the ground truth and a second visual representation of an output of an updated version of the machine-learned model relative to the ground truth.

I. The method as recited in any one of paragraphs F-H, wherein the threshold error is associated with minimizing a probability of a collision of the vehicle.

J. The method as recited in any one of paragraphs F-I, wherein the threshold error is an amount of error that is acceptable to a planning component of the vehicle in perception data inputs without increasing a probability of a vehicle collision above a threshold probability.

K. The method as recited in any one of paragraphs F-J, wherein the threshold error is associated with maintaining a comfort score requirement for operating the vehicle.

L. The method as recited in any one of paragraphs F-K, further comprising: inputting the sensor data into an updated version of the machine-learned model; receiving second perception data associated with the objects from the updated version of the machine-learned model; determining, based at least in part on the second perception data, a second error model including at least a second error between outputs of the updated version of the machine learned model and ground truths associated with the objects; and determining whether the updated version of the machine-learned model has improved or regressed based at least in part on a difference between the first error and the second error.

M. The method as recited in any one of paragraphs F-L, wherein the perception data includes a bounding box associated with an object of the objects, the bounding box indicative of at least one of a size of the object, an orientation of the object, or a location of the object in the environment.

N. The method as recited in any one of paragraphs F-M, wherein the perception data includes a velocity associated with an object of the objects.

O. The method as recited in any one of paragraphs F-N, wherein the perception data includes an indication of a predicted classification associated with an object of the objects, the predicted classification comprising at least one of another vehicle, a pedestrian, or a cyclist.

P. The method as recited in any one of paragraphs F-O, further comprising determining the threshold error based at least in part on: causing a simulated vehicle to traverse a simulated environment based at least in part on simulated perception data including errors relative to a ground truth; and determining whether the simulated vehicle experienced a collision while traversing the simulated environment.

Q. One or more non-transitory computer-readable media storing instructions that, when executed by one or more processors, cause the one or more processors to perform operations comprising: inputting, into a machine-learned model that is configured for use in a vehicle, sensor data associated with an environment; receiving, as outputs from the machine-learned model, perception data associated with objects detected in the environment; determining, based at least in part on the perception data, an error model including an error between an output of the machine-learned model and a ground truth associated with the sensor data; determining, based at least in part on a simulation using a planning component, that the error contributes to an adverse event; and based at least in part on the error contributing to the adverse event, determining that the machine-learned model is a regression to the vehicle.

R. The one or more non-transitory computer-readable as recited in paragraph Q, the operations further comprising: updating the machine-learned model based at least in part on the error; and sending, to the vehicle, an updated version of the machine-learned model for use by the vehicle to traverse an environment.

S. The one or more non-transitory computer-readable as recited in any one of paragraphs Q-R, wherein the perception data includes at least one of: a bounding box associated with an object of the objects; a velocity associated with the object; or a classification associated with the object.

T. The one or more non-transitory computer-readable as recited in any one of paragraphs Q-S, the operations further comprising determining the threshold error based at least in part on: causing a simulated vehicle to traverse a simulated environment based at least in part on simulated perception data including errors relative to a ground truth; and determining whether the simulated vehicle experienced a collision while traversing the simulated environment.

While the example clauses described above are described with respect to one particular implementation, it should be understood that, in the context of this document, the content of the example clauses can also be implemented via a method, device, system, computer-readable medium, and/or another implementation. Additionally, any of examples A-T may be implemented alone or in combination with any other one or more of the examples A-T.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system comprising:
one or more processors; and
one or more non-transitory computer-readable media storing instructions that, when executed by the one or more processors, cause the system to perform operations comprising:
inputting, into a first version of a perception system that is configured for use in an autonomous vehicle, sensor data associated with a simulated environment;
receiving, as outputs from the first version of the perception system, perception data associated with objects detected by a simulated vehicle representing the autonomous vehicle traversing the simulated environment;
generating, based at least in part on the perception data, a first error model indicating at least a first error between outputs of the first version of the perception system and a ground truth associated with the sensor data;
receiving a second error model indicating at least a second error between outputs of a second version of the perception system and the ground truth;
determining, based at least in part on a simulation using a planning component of the autonomous vehicle, that the first error and the second error are of an error type that is associated with contributing to an adverse event;
determining that the first version of the perception system is an improvement over the second version of the perception system based at least in part on a difference between the first error and the second error meeting or exceeding a threshold difference; and
sending the first version of the perception system to the autonomous vehicle based at least in part on the improvement.

2. The system of claim 1, wherein the perception data includes at least one of:
a bounding box indicative of at least one of a size, an orientation, or a location of an object of the objects;
a velocity of the object; or
a classification associated with the object.

3. The system of claim 1, wherein the threshold difference is associated with reducing a probability of a collision of the autonomous vehicle, the threshold difference determined based at least in part on:
inputting simulated perception data errors into at least one of the planning component or a prediction component of the autonomous vehicle, wherein the at least one of the planning component or the prediction component controls the simulated vehicle to traverse the simulated environment based at least in part on the simulated perception data errors; and
determining whether the simulated vehicle experienced a collision while traversing the simulated environment, the collision based at least in part on the simulated perception data errors.

4. The system of claim 1, wherein the first version of the perception system and the second version of the perception system each include one or more machine-learned models, the one or more machine-learned models of the first version of the perception system including an updated parameter relative to the second version of the perception system.

5. The system of claim 1, the operations further comprising outputting, based at least in part on the difference:

21 a first visual representation of a first output of the first version of the perception system relative to the ground truth; and a second visual representation of a second output of the second version of the perception system relative to the ground truth.

6. A method comprising:

inputting, into a machine-learned model that is configured for use in a vehicle, sensor data associated with an environment;

receiving, as outputs from the machine-learned model, perception data associated with objects detected in the environment;

determining, based at least in part on the perception data, an error model including an error between an output of the machine-learned model and a ground truth associated with the sensor data;

determining, based at least in part on comparing the error to a threshold error and a simulation using a planning component, that the error contributes to an adverse event;

based at least in part on the error contributing to the adverse event, determining that the machine-learned model is a regression to the vehicle;

updating the machine-learned model based at least in part on the error; and sending, to the vehicle, an updated version of the machine-learned model for use by the vehicle to traverse the environment.

7. The method of claim 6, further comprising providing a visualization associated with updating the machine-learned model, the visualization including at least a first visual representation of the output of the machine-learned model relative to the ground truth and a second visual representation of an output of the updated version of the machine-learned model relative to the ground truth.

8. The method of claim 6, wherein the threshold error is associated with minimizing a probability of a collision of the vehicle.

9. The method of claim 6, wherein the threshold error is an amount of error that is acceptable to the planning component of the vehicle in perception data inputs without increasing a probability of a vehicle collision above a threshold probability.

10. The method of claim 6, wherein the threshold error is associated with maintaining a comfort score requirement for operating the vehicle.

11. The method of claim 6, wherein the error is a first error and the method further comprising:

inputting the sensor data into the updated version of the machine-learned model;

receiving second perception data associated with the objects from the updated version of the machine-learned model;

determining, based at least in part on the second perception data, a second error model including at least a second error between outputs of the updated version of the machine-learned model and ground truths associated with the objects; and determining whether the updated version of the machine-learned model has improved or regressed based at least in part on a difference between the first error and the second error.

12. The method of claim 6, wherein the perception data includes a bounding box associated with an object of the objects, the bounding box indicative of at least one of a size of the object, an orientation of the object, or a location of the object in the environment.

13. The method of claim 6, wherein the perception data includes a velocity associated with an object of the objects.

14. The method of claim 6, wherein the perception data includes an indication of a predicted classification associated with an object of the objects, the predicted classification comprising at least one of another vehicle, a pedestrian, or a cyclist.

15. The method of claim 6, further comprising determining the threshold error based at least in part on:

causing a simulated vehicle to traverse a simulated environment based at least in part on simulated perception data including errors relative to the ground truth; and determining whether the simulated vehicle experienced a collision while traversing the simulated environment.

16. One or more non-transitory computer-readable media storing instructions that, when executed by one or more processors, cause the one or more processors to perform operations comprising:

inputting, into a machine-learned model that is configured for use in a vehicle, sensor data associated with an environment;

receiving, as outputs from the machine-learned model, perception data associated with objects detected in the environment;

determining, based at least in part on the perception data, an error model including an error between an output of the machine-learned model and a ground truth associated with the sensor data;

determining, based at least in part on comparing the error to a threshold error and a simulation using a planning component, that the error contributes to an adverse event;

based at least in part on the error contributing to the adverse event, determining that the machine-learned model is a regression to the vehicle;

updating the machine-learned model based at least in part on the error; and sending, to the vehicle, an updated version of the machine-learned model for use by the vehicle to traverse the environment.

17. The one or more non-transitory computer-readable of claim 16, wherein the perception data includes at least one of:

a bounding box associated with an object of the objects;

a velocity associated with the object; or a classification associated with the object.

18. The one or more non-transitory computer-readable of claim 16, the operations further comprising determining the threshold error based at least in part on:

causing a simulated vehicle to traverse a simulated environment based at least in part on simulated perception data including errors relative to the ground truth; and determining whether the simulated vehicle experienced a collision while traversing the simulated environment.

19. The one or more non-transitory computer-readable of claim 16, wherein the error is a first error and the operations further comprising:

inputting the sensor data into the updated version of the machine-learned model;

receiving second perception data associated with the objects from the updated version of the machine-learned model;

determining, based at least in part on the second perception data, a second error model including at least a second error between outputs of the updated version of the machine-learned model and ground truths associated with the objects; and determining whether the updated version of the machine-learned model has improved or regressed based at least in part on a difference between the first error and the second error.

20. The one or more non-transitory computer-readable of claim 16, wherein the threshold error is an amount of error that is acceptable to the planning component of the vehicle in perception data inputs without increasing a probability of a vehicle collision above a threshold probability.

\* \* \* \* \*